(12) United States Patent
Dutta

(10) Patent No.: US 8,304,759 B2
(45) Date of Patent: Nov. 6, 2012

(54) INTEGRATED IMAGE SENSOR SYSTEM ON COMMON SUBSTRATE

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 205 days.

(21) Appl. No.: 12/821,114

(22) Filed: Jun. 22, 2010

(65) Prior Publication Data

US 2010/0320444 A1 Dec. 23, 2010

Related U.S. Application Data

(60) Provisional application No. 61/219,118, filed on Jun. 22, 2009.

(51) Int. Cl.
*H01L 29/06* (2006.01)
*H01L 31/072* (2012.01)
*H01L 31/109* (2006.01)
*H01L 31/0328* (2006.01)
*H01L 31/0336* (2006.01)

(52) U.S. Cl. .............. 257/21; 257/9; 310/338

(58) Field of Classification Search .......... 257/9, 21, 257/440, E27.133; 977/762, 765, 956; 310/338
See application file for complete search history.

(56) References Cited

U.S. PATENT DOCUMENTS

| 8,039,834 B2 * | 10/2011 | Wang et al. .............. 257/43 |
| 2009/0002266 A1 * | 1/2009 | Li et al. ..................... 345/6 |
| 2009/0152664 A1 * | 6/2009 | Klem et al. ................ 257/440 |

* cited by examiner

*Primary Examiner* — Phuc Dang

(57) ABSTRACT

It is highly desirable to design a monolithic image sensor (and array), which could offer high quantum efficiency over broad spectral ranges, and the possibility to rapidly and randomly address any element in the array. This invention utilizes the growth of semiconductor nanowires such as Si, Ge, Si:Ge, ZnO, or their alloys based nanowires on standard substrates to create multispectral image sensors and photovoltaic cells having these highly desirable features.

20 Claims, 6 Drawing Sheets

FIG. 5
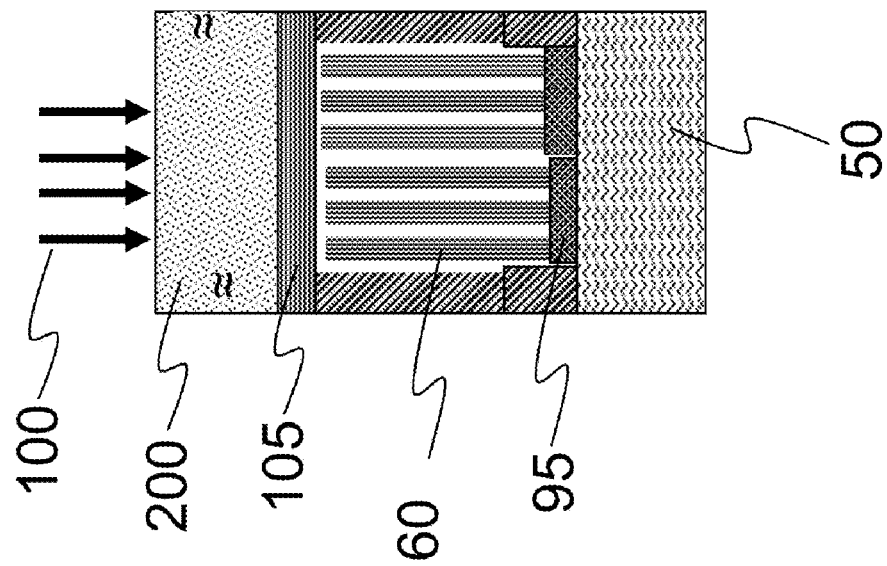
FIG. 5B
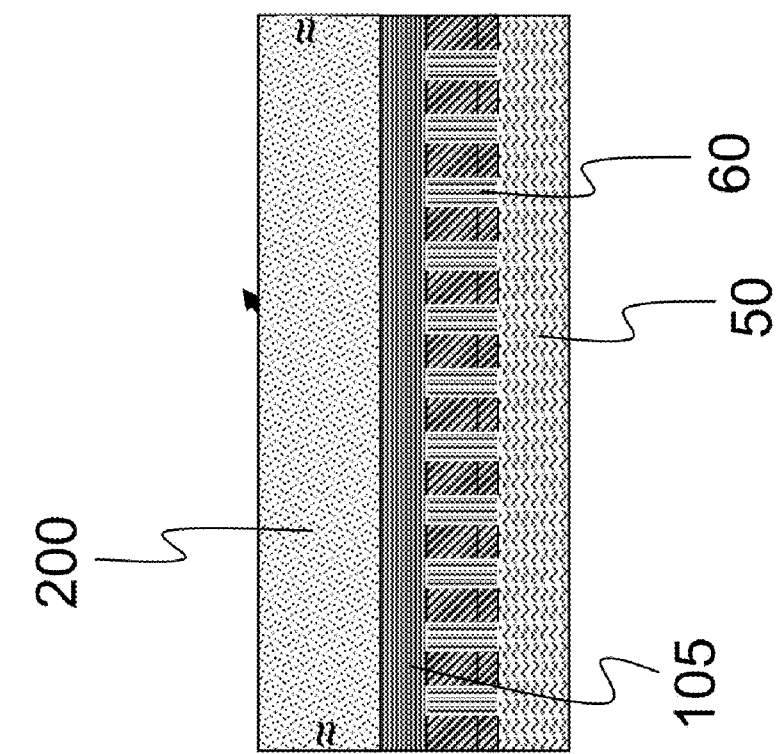
FIG. 5A

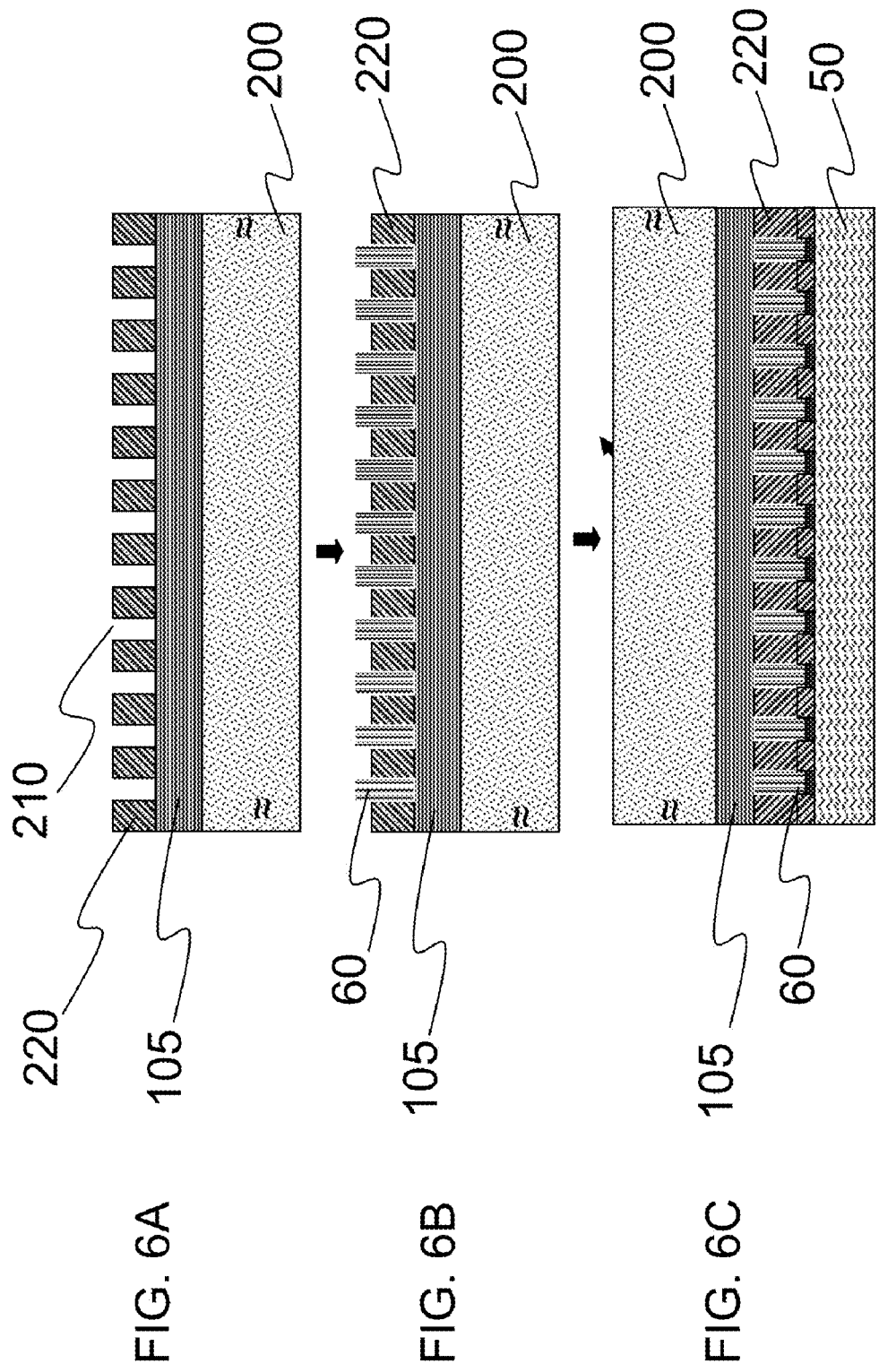

INTEGRATED IMAGE SENSOR SYSTEM ON COMMON SUBSTRATE

CROSS REFERENCE TO RELATED APPLICATIONS

This application claims the benefit of U.S. Provisional application No. 61/219,118 filed on Jun. 22, 2009.

FIELD OF THE INVENTION

This invention relates to image sensor and photovoltaic cell technology. More specifically, this invention relates to photodiode technology having broad spectral detection ranges. This invention also relates to semiconductor nanowires such as Ge, Si, Zinc Oxide (ZnO), InP, Si:Ge, their alloys, etc. based nanostructures.

BACKGROUND OF THE INVENTION

For covering broad spectral ranges, conventionally two photodiodes fabricated from Si and InP technology, discretely integrated, are usually used. Although wafer bonding can be used to bond Si and InP to cover shorter and longer wavelengths, the reliability of wafer bonding over wide range of temperatures is still an unsolved issue and a high-speed operation is not feasible with a wafer bonding approach. In addition, the manufacturing yield is low, resulting in high cost for this type of photodiode. Besides, even detectors having broad spectral detection ranges (UV to near IR) utilizing the wafer bonding technology have not been developed yet. It is highly desirable to design a monolithic image sensor (and array), which could offer high quantum efficiency (>90%) over broad spectral ranges (UV to near IR), and the possibility to rapidly and randomly address any element in the array.

SUMMARY OF THE INVENTION

This invention utilizes the growth of semiconductor nanowries such as Si, Ge, ZnO, InP, Si:Ge, or their alloyd semiconductor nanowires, (hereafter also called NWs) on a standard substrate to create multispectral image sensors and photovoltaic cells. The Semiconductor nanowires such as Si, Ge, or ZnO based nanowires including their alloyed semiconductor nanowires are grown and integrated into the substrate, such as silicon, glass, polymer, etc. The nanowire based image sensors and photovoltaic cells provide better quantum efficiency and conversion efficiency due to the wide spectral response. Having both sensing and power generation capability allows to operate the device in 24/7 without anxious of battery or other power supplies.

BRIEF DESCRIPTION OF THE DRAWINGS

FIG. 4A represents a schematic of a nanowire photoconductor type energy generation device or photovoltaic type energy device.
FIG. 4B represents a schematic of the nanowire energy band diagrams in the dark.
FIG. 4C represents a schematic of the nanowire energy band diagrams under UV illumination.
FIG. 5 represents cross-sectional views of the image sensor according to the present invention, grown on ITO/glass.
FIG. 5A represents an array,
and FIG. 5B represents a single pixel.
FIG. 6 represents the process flow of top-down approach for fabrication of the image sensor according to the present invention, using an ITO/glass substrate.
FIG. 6A represents making insulator grooved structure on ITO.
FIG. 6B represents growing the ZnO or its alloyed nanowires onto the ITO/glass substrate.
FIG. 6C represents transferring the structure to the Si-CMOS ROIC.

DESCRIPTION OF THE PREFERRED EMBODIMENTS

For simplicity, we would provide an example in related to Zinc oxide (ZnO) or its alloyed nanowires. However, it can be related to other semiconductor NWs, as mentioned earlier.

ZnO is a wide direct band gap semiconductor (Eg=3.4 eV) that displays unique features such as large exciton binding energy (Eb=60 meV) and large piezoelectric and ferromagnetic coefficients with a predicted Curie temperature above room temperature when doped with transition metals. The availability of a rich genre of nanostructures make ZnO an ideal material for nanoscale optoelectronics, electronics, and biotechnology. Making alloyed with other materials, ZnO based alloyed semiconductor has the light absorption capability extending from deep UV to near infrared wavelengths. Functional devices such as vertical nanowire (NW) FETs piezoelectric nanogenerators, optically pumped nanolasers, and biosensors have already been demonstrated. In addition, ZnO and its alloyed based nanowire responds to photons of light at greater distances than current UV and IR sensors. Furthermore, ZnO based alloyed NWs based image sensor and photovoltaic (PV) cells should provide better quantum efficiency and conversion efficiency, respectively due to having wide spectral response. Integrating both ZnO based alloyed image sensor and PV cells on a common substrate can open up future military applications, especially multispectral sensor system able to measure/sense the energetic event, determine line of bearing, line of sight angle, and range.

Figure 1:
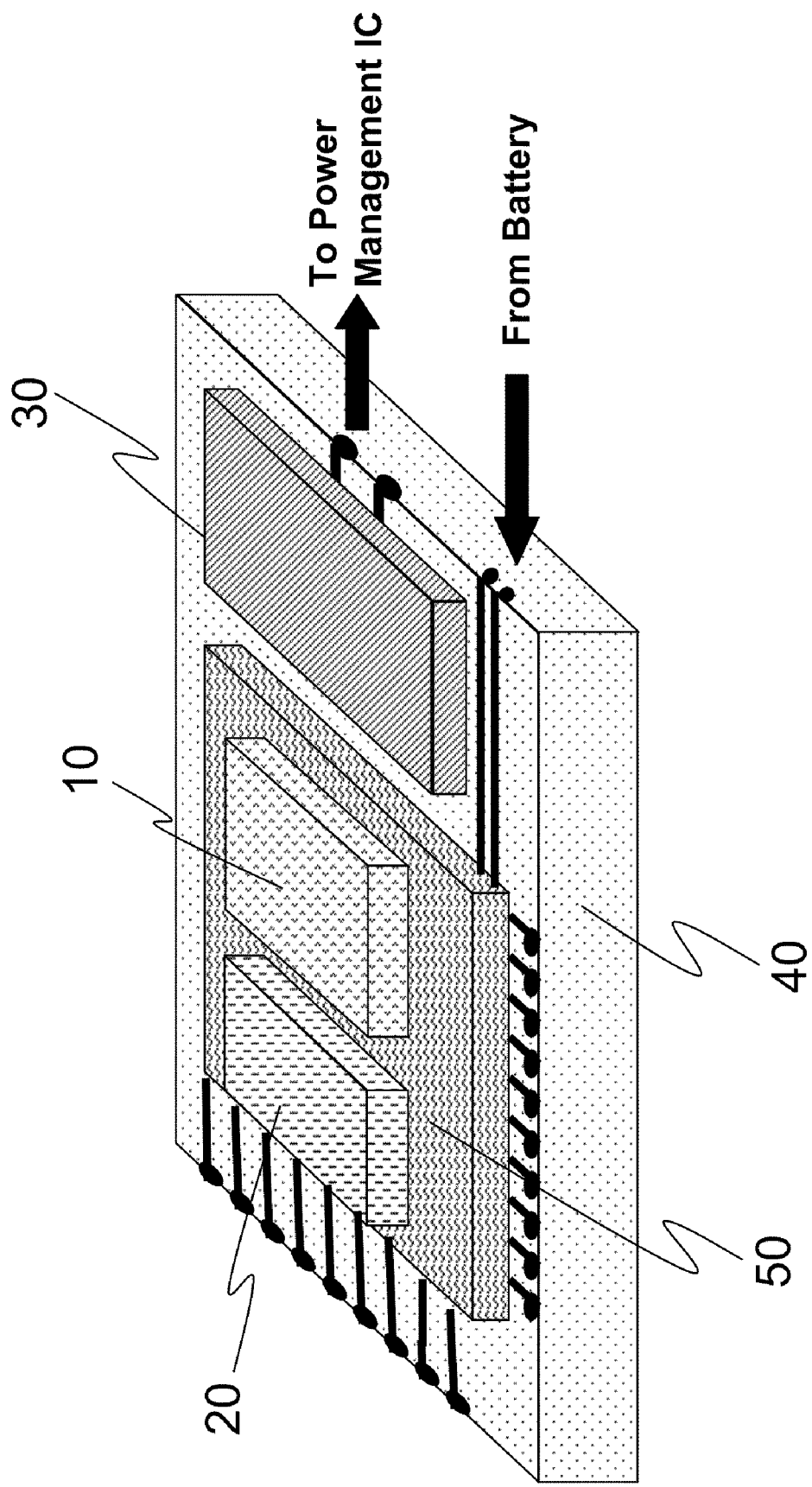
FIG. 1 shows an integrated image sensor with photovoltaic cells.

FIG. 1 shows an integrated image sensor with photovoltaic cells. It comprises an image sensor 10 having spectral detection capabailities from UV to near infrared, an infrared image sensor 20, and a photovoltaic cell 30 all contained on a common carrier 40. The two image sensors are contained on a CMOS carrier like silicon, semiconductor, or dielectric 50.

Fabrication and integration of ZnO and its alloyed NW technology can reduce size, weight and power requirements from current UV and IR sensor systems, which require complex cooling systems. Integrating ZnO based power generation device (i.e. PV cells) 30 with the sensor array 10 enable a sensor system for remote application. To date, sensor system is either operated by the battery or direct power supplies to feed the power to the sensor system. The power generation device incorporating in sensor system allows to supply alternative power generation source to harvest energy from the solar light to recharge the battery to allow to work for many years.

The power generation source 30 can be made from any semiconductor, varying from Si, or any nanowires like ZnO, Si, etc. According to the invention, the power generation source is also made from ZnO, its alloyed nanowires, or any NWs and can be made directly on the Si Substrate.

The image sensor is also fabricated utilizing NWs such as ZnO, Si etc, fabricated utilizing the semiconductor process. The details structure and fabrication is described later.

To date, a repeatable synthesis process that yields a consistent ZnO or its alloyed based NWs alignment on a substrate does not exist. Current ZnO synthesis techniques do not consistently align the nanowires into useable, deliberate arrays.

The ZnO nanowires can be formed by various methods. Evaporation and condensation processes are favored for their simplicity and high-quality products, but these gas-phase approaches generally require economically prohibitive temperatures of 800-900° C. Despite recent MOCVD schemes that reduced the deposition temperature to 450° C. by using organometallic zinc precursors, the commercial potential of gas-phase-grown ZnO nanowires remains constrained by the expensive and/or insulating (for example, $Al_2O_3$) substrates required for oriented growth, as well as the size and cost of the vapor deposition systems.

For reducing temperature further below 450° C. for realistic device applications, we develop a low-temperature, large-scale, and versatile synthetic process for growing ZnO of its alloyed based nanowire arrays on large area of low-cost substrates (e.g. polymer, Si, glass etc.).
The ZnO or its alloyed based nanowires are synthesized through solution method at low temperature similar to the reported process. However, we use a sputtered oxide thin film instead of ZnO nanoparticles, which offers significant advantages of growth on patterned substrates, including sapphire, glass, Si, ITO, and even flexible polymers, and easier processing. The nanowire growth on Si or sapphire substrates is carried in an aqueous solution of zinc acetate and diethylenetriamine at 90° C. for 3 hours. The nanowires are uniformly covering the entire substrate with diameter of 70-150 nm and length of 1.5 μm. X-ray diffraction (not shown) gave a wurtzite ZnO pattern with an enhanced peak resulting from the vertical orientation of the nanowires.

Figure 2:
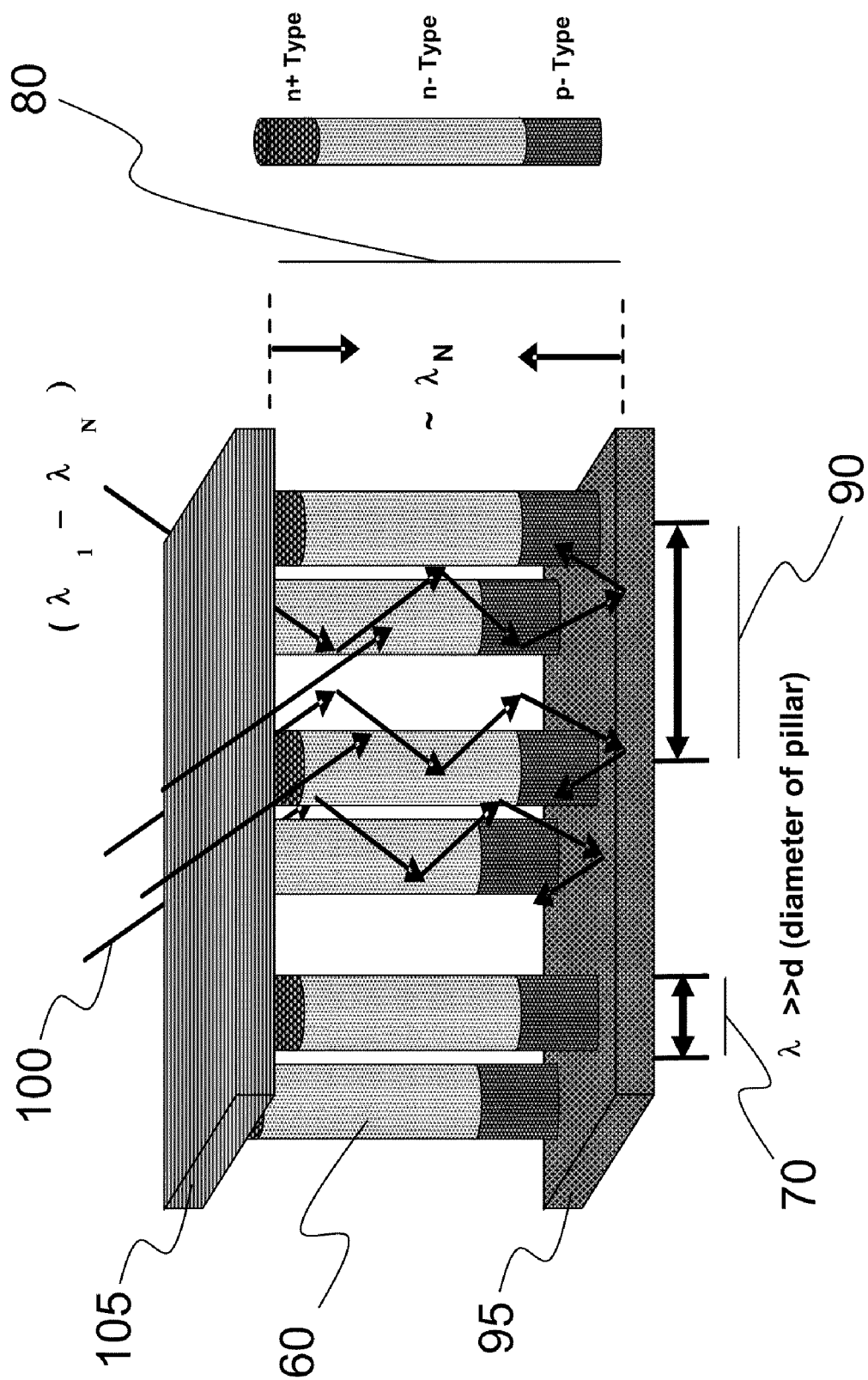
FIG. 2 represents the light trapping technique for a pixel having multiple nanowires, with UV to near infrared spectral detection capabilities.
Figure 3:
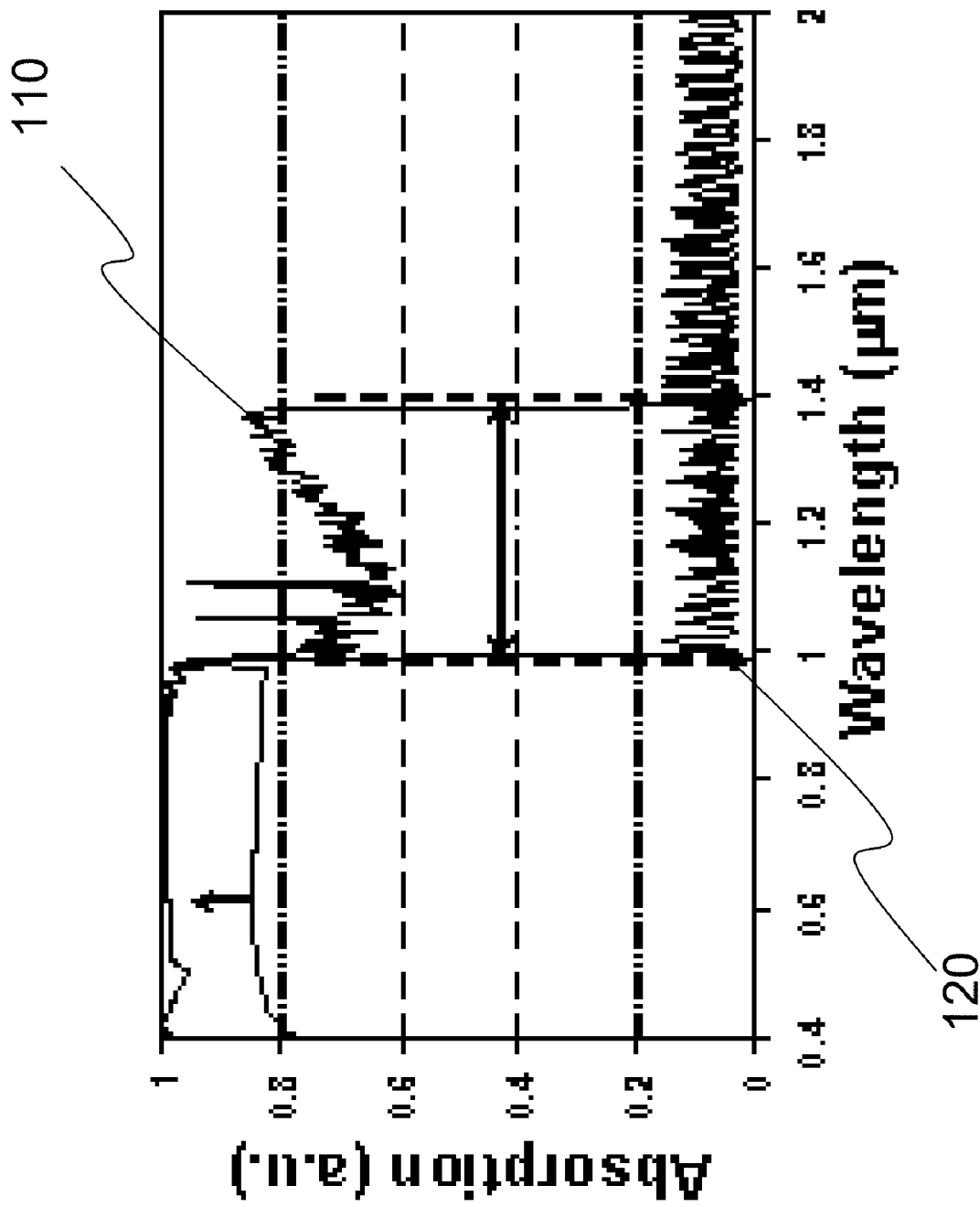
FIG. 3 represents simulated results comparing the absorption spectra with nanowires to without nanowires.

FIG. 2 shows the light trapping technique in a pixel of an image sensor having broad spectral detection capabilities of UV to near infrared according to the present invention. Each pixel of image sensor comprises multiple nanowires 60 periodically arranged with pre-designed diameter 70, length 80, and pillar-pitch 90, arranged in specific area, on a contact 95, which contacts conformal substrates, for example CMOS based ROIC (not shown). Light 100 enters through a transparent metal 105. In each pixel, nanowire diameters and pitch can be fixed or randomly varied. Each pixel consists of p-n, p-i-n, quantum well, photoconductor structure (not shown all here), formed on the standard substrate. Array of pixel will be transferred on the conformal substrates for example CMOS based ROIC. Each pixel comprising with array of nano-scaled pillars can be arranged as ensemble of photon trapping to significantly (i) increase the absorption efficiency as compared to its macro-scaled thin-film pixel and (ii) eliminate the surface reflection. FIG. 3 shows simulated results of both a structure comprising multiple nanowires 110 and a structure without nanowires 120 made from InP material as an example. Nanowires of diameter 0.1 μm and spaces of 0.1 μm are considered in the simulation. As depicted, (i) cut-off wavelength is extended to 1.4 μm, more than thin film InP whose cut-off wavelength is vicinity of 1 μm, and (ii) more absorption is seen in shorter wavelength.

Utilizing the array of nano-scaled wires (hereafter also called 3-dimensional blocks) in each pixel allows (i) reduction of material volume (area) while keeping absorption efficiency increases the signal to noise ratio, (ii) for increased sensitivity at higher temperature, (iii) full depletion at lower/no bias, (iv) Auger suppression, and (v) higher temperature of operation. As mentioned, extending of detection capability from UV to near IR ranges can be achieved by varying the diameter and pitch of the ZnO and its alloyed NWs. The ZnO and its alloyed based NWs can be deposited either directly on the Si-CMOS or ITO deposited glass substrate, transferred the pixel to the foreign substrate (in this case CMOS ROIC).

Figure 4:
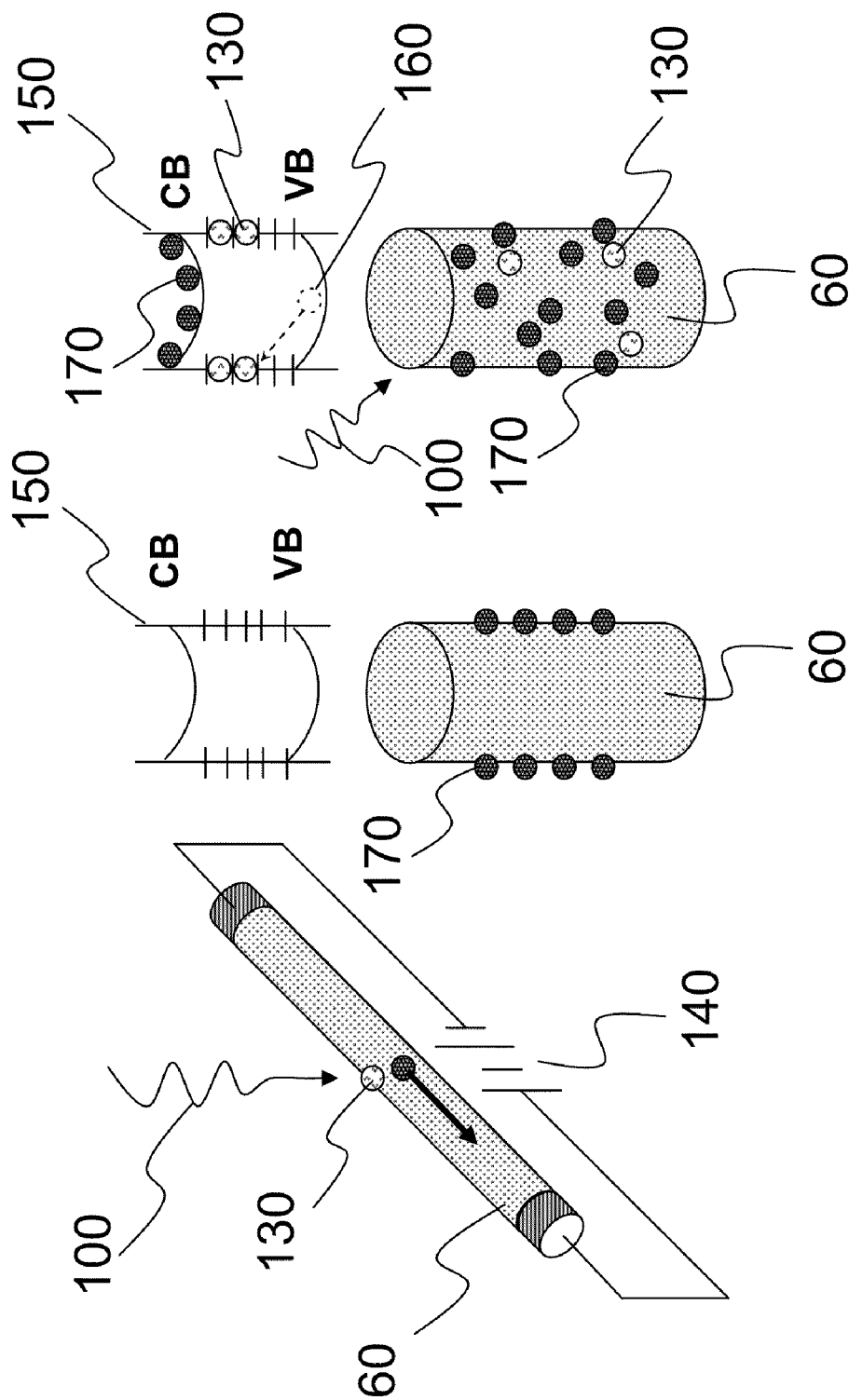
FIG. 4 shows a schematic of the photoconduction mechanism in the presence of a high density of hole-trap states at the nanowire surface.

ZnO and its alloyed based NWs based photodetector have high internal gain, which helps to increase the sensitivity. Because of the high surface-to-volume ratio, trapping at surface states drastically affects the transport and photoconduction properties of NWs. FIG. 4 shows a schematic of the photoconduction mechanism in the presence of a high density of hole-trap states at the NW 60 surface; upon illumination with photon energy 100 larger than the semiconductor band gap (Eg), electron-hole pairs are photogenerated and holes are readily trapped at the surface, leaving behind unpaired electrons 130, which increase the conductivity under an applied electric field 140. Schematics of the NW energy band diagrams 150 in dark and under illumination are displayed in FIGS. 4B and 4C, respectively, illustrating the charge separation process of photogenerated electrons and holes 160 under the intrinsic NW electric field and the occupation of surface states by photogenerated holes. In ZnO, it has been previously shown that the following trapping mechanism is governing the photoconduction in thin films and NWs: in the dark (FIG. 4B), oxygen molecules 170 are adsorbed on the oxide surface and capture the free electrons present in the n-type oxide semiconductor [O2(g)+e−fO2−(ad)], and a low-conductivity depletion layer is formed near the surface. Upon illumination at a photon energy above Eg (FIG. 4C), electron-hole pairs are photogenerated [hV f e−+h+]; holes migrate to the surface along the potential slope produced by band bending and discharge the negatively charged adsorbed oxygen ions [h++O2−(ad) f O2(g)], and consequently, oxygen is photodesorbed from the surface. The unpaired electrons 130 are either collected at the anode or recombine with holes generated when oxygen molecules are readsorbed and ionized at the surface. This hole-trapping mechanism through oxygen adsorption and desorption in ZnO NWs augments the high density of trap states usually found in NWs due to the dangling bonds at the surface and thus enhances the NW photoresponse. It is well-known that photoconductors with blocking contacts, i.e., with a Schottky barrier at the metal electrode-semiconductor interface, can exhibit hole-trapping in the reversed-bias junction that shrinks the depletion region and allows tunneling of additional electrons into the photoconductor; if electrons pass multiple times, this mechanism yields photoconductive gain greater than unity. Suppressed recombination of charge carriers has also been reported in PIN diodes with blocking contacts and type II doping superlattices, where the increase of photocurrent lifetime results in large photoconductive gain. Here we propose a similar mechanism to be effective in ZnO based NWs, where holes are efficiently trapped at surface states (in ZnO NWs trapping time is increased by oxygen desorption from the surface) and multiple electron passes through the NW can lead to photoconductive gain.

Alternatively, the carrier (in this case) trapping can also be attained using the polymer legand layer as the passivation to reduce the carrier recombination and enhance the optical performance.

FIG. 5 shows cross-sectional views of the proposed image sensor. FIG. 5A shows an array, and FIG. 5B shows a single pixel. As mentioned earlier, the image sensor is based on nano-scaled wires (a.k.a. nanowires) 60 in each pixel. The NWs 60 could be p-i-n type, p-i-p type or n-i-n type semiconductor, made in top-down approach. Device can be fabricated with either photovoltaic or photoconductor operation. Any material system, suitable to absorb light of any wavelengths can be used. We propose to utilize ZnO NWs based material possible to make room temperature operation with high detectivity and multispectral response. The ZnO based NWs are grown on substrate (like Si or glass). For Si substrate case, ZnO based NWs can be grown either (i) directly on the CMOS-ROIC, or (ii) on Si substrate, which is later transferred to CMOS-ROIC and etched-off the Si-Substrate. For Glass substrate case (shown in FIG. 5), ZnO based NWs are grown onto to conductive layer 105 (e.g. ITO/Si) on glass 200, and bonded directly to CMOS-ROIC 50. Light 100 is illuminated from bottom side.

Top down 'Top-Down' approach, defined as an approach in which standard CMOS process technologies are utilized to fabricate the proposed image sensor and its integration to ROIC. The 'Top-Down' approach, shown in FIG. 6, comprises the process steps including: (FIG. 6A) making grooved structure 210 through insulator 220 using dry-etching, (FIG. 6B) growing ZnO based NWs 60 into the grooved structure, where each grooved structure represents a pixel, and (FIG. 6C) transforming the nanostructures to the Si-CMOS ROIC 50.

Although the invention has been described with respect to specific embodiments for complete and clear disclosure, the invention is not to be thus limited but is to be construed as embodying all modifications and alternative constructions that may occur to one skilled in the art that fairly fall within the basic teaching heretofore set forth.

According to this invention, the nanometer(s)-scale wires are mentioned, but it also covers nano-scale rods, nano-scale tubes, or nano-scale pillars (a,k,a, nanorods, nanotubes, nanopillars), and those can be any kinds of electronics materials covering semiconductor, insulator or metal.

According to this invention, the nanometer sized rods, wire or tubes can be made from the semiconductors such as ZnO, its alloys, Si, Ge, or compound semiconductors from III-V or II-VI groups. As an example for rods, wire, or tubes, ZnO, InP, GaAs, GaN, their alloys, or III-V compound semiconductor can be used and they can be made using standard growth process for example, MOCVD, MBE, chemical synthesis, or standard epitaxial growth. According to this invention, the self-assembled process can also be used to make wires, rods, or tubes and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, ZnO, ZnMgO, ZnBeO, ZnCdO, CdTe, CdS, ZnCdTe, HgCdTe, etc. The substrate can cover also all kinds of polymers or ceramics such as AlN, Silicon-oxide etc.

According to this invention, the nanometer sized rods, wire or tubes based on II-VI compound semiconductor can also be used. As an example CdTe, CdS, Cdse, ZnS, or ZnSe can also be used, and they can be made using standard growth process for example, sputtering, evaporation, MOCVD, MBE, or standard epitaxial growth. According to this invention, the self-assembled process can also be used to make wire, rods, or tubes and their related pn-junction to increase the junction area. These rods, wire, or tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

According to this invention, the nanometer sized rods, wire or tubes can be made from the carbon type materials (semiconductor, insulators, or metal like performances) such as carbon nano-tubes, which could be single, or multiple layered. They can be made using standard growth process for example, MOCVD, MBE, or standard epitaxial growth. According to this invention, the self-assembled process can also be used to make wires, rods, or tubes and their related pn-junction to increase the junction area. These tubes can be grown on the semiconductors (under same group or others), polymers, or insulator. Alternatively, according to this invention, these rods, wire, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can cover also all kinds of polymers or ceramics such as AlN, Silicon-oxide etc.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope. Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in the novel self-operated integrated sensor system. The proposed invention can be used for fabricating wide solar panel for both commercial, military, and space applications.

What is claimed is:

1. An image sensor comprising:
a conductive layer having a top surface and a bottom surface;
an array of pixels having an upper surface and a lower surface, disposed on the bottom surface of said conductive layer such that the upper surface of said array of pixels connects with the bottom surface of said conductive layer, wherein each pixel of said array of pixels comprises:
a plurality of semiconductor nanowires having top tips and bottom tips; and
a conductive contact disposed on said plurality of semiconductor nanowires,
wherein the top tips of said nanowires connect to the bottom surface of said conductive layer and the bottom tips of said nanowires connect to said conductive contacts,
and wherein said array of pixels has a certain height;

at least one first insulator having a first surface and a second surface, disposed on the bottom surface of said conductive layer between said pixels, wherein said at least one first insulator has a height lower than said array of pixels and wherein the first surface of said at least one first insulator is connected to the bottom surface of said conductive layer;

at least one second insulator disposed on the second surface of said at least one first insulator, wherein said at least one second insulator has a height high enough to make up the difference in height between said pixels and said at least one first insulator, thereby creating at least one insulator support structure which is the same height as said array of pixels;

and a first conformal substrate disposed on the lower surface of said array of pixels and said at least one insulator support structure.

2. An image sensor according to claim 1, further comprising a second substrate disposed below said conductive layer.

3. An image sensor according to claim 2, wherein said second substrate is selected from the group consisting of: a dielectric substrate, a semiconductor substrate, and a metallic substrate.

4. An image sensor according to claim 2, wherein said second substrate is comprised of glass, and said conductive layer is comprised of ITO.

5. An image sensor according to claim 1, wherein said conformal substrate is a CMOS based ROIC.

6. An image sensor according to claim 1, wherein said semiconductor nanowires are comprised of a material selected from the group consisting of: ZnO, ZnMgO, ZnBeO, ZnCdO, Si, Ge, Si:Ge, InP, and their alloys.

7. An image sensor according to claim 1, wherein each of said plurality of semiconductor nanowires comprise more than one semiconductor type, thereby providing at least one semiconductor junction in each of said nanowires, and wherein said semiconductor junctions are selected from the group consisting of: p-n, p-i-n, p-i-p, n-i-n, Schottky, and a combination thereof.

8. An image sensor according to claim 1, wherein the diameter of said nanowires is not less than 20 nanometers and not greater than 1000 nanometers, the height of said nanowires is not less than 200 nanometers and not greater than 5000 nanometers, and the pitch of said nanowires in a given pixel is not less than 20 nanometers and not greater than 1000 nanometers.

9. An image sensor according to claim 1, wherein said nanowires are selected from the group consisting of: nanowires having varied diameters, nanowires having varied lengths, nanowires having varied pitches, and a combination thereof.

10. An image sensor according to claim 1, further comprising a bonding agent between said first insulator and said second insulator.

11. An image sensor according to claim 1, wherein said conductive contact comprises conductive polymer or eutectic alloyed metal.

12. An image sensor comprising:
a transparent substrate;
a transparent conductive layer having a top surface and a bottom surface disposed on said transparent substrate wherein said top surface of the transparent conductive layer connects to said transparent substrate;
an array of pixels having an upper surface and a lower surface, disposed on the bottom surface of said transparent conductive layer, such that the upper surface of said array of pixels connects with the bottom surface of said transparent conductive layer wherein each pixel comprises
a plurality of semiconductor nanowires having top tips and bottom tips;
and a conductive contact disposed on said plurality of semiconductor nanowires, wherein the top tips of said nanowires connect to the bottom surface of said transparent conductive layer and the bottom tips of said semiconductor nanowires connect to said transparent conductive contact either by touching or partially embedding in said transparent conductive contact, and wherein said array of pixels has a certain height;

at least one first insulator having a first surface and a second surface disposed on the bottom surface of said transparent conductive layer between said pixels, wherein said at least one first insulator has a height lower than the height of said array of pixels and wherein the first surface of said at least one first insulator is connected to the bottom surface of said transparent conductive layer;

at least one second insulator disposed on the second surface of said at least one first insulator, wherein said at least one second insulator has a height high enough to make up the difference in height between said array of pixels and said at least one first insulator, thereby creating at least one insulator support pillar which has the same height as said array of pixels;

and a CMOS carrier disposed on the lower surface of said array of pixels and said at least one insulator support pillar;

wherein each of said semiconductor nanowires comprises more than one semiconductor type, thereby providing at least one semiconductor junction in each of said nanowires.

13. An image sensor according to claim 12, wherein said substrate is selected from the group consisting of: a dielectric substrate, a semiconductor substrate, and a metallic substrate.

14. An image sensor according to claim 12, wherein said semiconductor nanowires are comprised of a material selected from the group consisting of: ZnO, ZnMgO, ZnBeO, ZnCdO, Si, Ge, Si:Ge, InP, and their alloys.

15. An image sensor according to claim 12, wherein said nanowires are selected from the group consisting of: nanowires having varied diameters, nanowires having varied lengths, nanowires having varied pitches, and a combination thereof.

16. An image sensor according to claim 12, wherein said conductive contact comprises conductive polymer or eutectic alloyed metal.

17. An image sensor according to claim 12, further comprising a bonding agent between said first insulator and said second insulator.

18. An image sensor system comprising:
a common carrier;
a power generation source disposed on said common carrier;
a CMOS carrier disposed on said common carrier;
a first image sensor disposed on said CMOS carrier, wherein said first image sensor is capable of infrared spectral detection;
and a second image sensor disposed on said CMOS carrier, wherein said second image sensor comprises:
an array of pixels disposed on said CMOS carrier, wherein each pixel comprises a metal contact disposed on said CMOS carrier and a plurality of semiconductor nanowires disposed on said metal contact;
insulator disposed between said pixels;

and a transparent conductive layer disposed on said array of pixels.

19. An image sensor system according to claim 18, wherein said power generation source is a photovoltaic cell comprising semiconductor nanowires.

20. An image sensor system according to claim 18, wherein said image sensor further comprises a transparent substrate disposed on said transparent conductive layer.

* * * * *